United States Patent
Amano (10) Patent No.: US 8,710,734 B2
(45) Date of Patent: Apr. 29, 2014

(54) LIGHT EMITTING DEVICE

(75) Inventor: Seiko Amano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/612,249

(22) Filed: Sep. 12, 2012

(65) Prior Publication Data

US 2013/0001608 A1  Jan. 3, 2013

Related U.S. Application Data (60) Continuation of application No. 12/874,372, filed on Sep. 2, 2010, now Pat. No. 8,283,859, which is a division of application No. 11/652,487, filed on Jan. 12, 2007, now Pat. No. 7,812,524.

(30) Foreign Application Priority Data

Jan. 18, 2006 (JP) ................................ 2006-010197

(51) Int. Cl.
  *H01L 33/08* (2010.01)
(52) U.S. Cl.
  USPC ............ 313/504; 313/505; 313/506; 313/512
(58) Field of Classification Search
  USPC ................................ 313/495–512; 445/24–25
  See application file for complete search history.

(56) References Cited

U.S. PATENT DOCUMENTS

| | | | |
|---|---|---|---|
| 6,288,764 B1 | 9/2001 | Zhang et al. | |
| 6,822,264 B2 | 11/2004 | Yamazaki et al. | |
| 6,992,332 B2 | 1/2006 | Yamazaki et al. | |
| 7,071,619 B2 | 7/2006 | Iwase et al. | |
| 7,291,970 B2 | 11/2007 | Kuwabara | |
| 7,309,269 B2 | 12/2007 | Yamazaki et al. | |
| 7,474,375 B2 | 1/2009 | Kwak et al. | |
| 7,486,368 B2 | 2/2009 | Sakakura et al. | |
| 7,723,179 B2 | 5/2010 | Yamazaki et al. | |

(Continued)

FOREIGN PATENT DOCUMENTS

| | | |
|---|---|---|
| EP | 1 492 390 A2 | 12/2004 |
| JP | 2003-142259 | 5/2003 |

(Continued)

OTHER PUBLICATIONS

Korean Office Action (Application No. 2007-0004225; KR09342) Dated May 21, 2013.

*Primary Examiner* — Anh Mai
*Assistant Examiner* — Elmito Breval
(74) *Attorney, Agent, or Firm* — Nixon Peabody LLP; Jeffrey L. Costellia (57) ABSTRACT

It is an object of the present invention to prevent an insulating film from peeling in a section where the insulating film is adjacent to a sealing region. Over a first substrate 104, a pixel portion 100 provided with a light emitting element, a source driver 101, a gate driver 102, and a sealing region 103 are provided. A light emitting element is sealed between the first substrate 104 and a second substrate 110 by a sealant 108. An insulating film 107 serves as a partition wall of the light emitting element. An end portion of the insulating film 107 which is adjacent to the sealing region 103 does not overlap with a step formed by a side surface and an upper surface of a conductive film 106 which serves as a wiring.

30 Claims, 10 Drawing Sheets

(56) References Cited

U.S. PATENT DOCUMENTS

| | | |
|---|---|---|
| 7,838,347 B2 | 11/2010 | Suzawa et al. |
| 8,382,545 B2 | 2/2013 | Sakakura et al. |
| 2003/0009461 A1 | 1/2003 | Notargiacomo et al. |
| 2005/0001546 A1 | 1/2005 | Yamaguchi |
| 2005/0067953 A1 | 3/2005 | Yamazaki et al. |
| 2005/0180721 A1 | 8/2005 | Hayashi et al. |
| 2005/0211984 A1 | 9/2005 | Murakami et al. |
| 2005/0269926 A1 | 12/2005 | Fukuoka et al. |
| 2005/0274949 A1 | 12/2005 | Yamazaki et al. |
| 2006/0043510 A1 | 3/2006 | Yamazaki et al. |
| 2007/0164675 A1* | 7/2007 | Amano ................. 313/512 |

FOREIGN PATENT DOCUMENTS

| | | |
|---|---|---|
| JP | 2004-047446 | 2/2004 |
| JP | 2005-222860 | 8/2005 |
| KR | 2005-0002572 | 1/2005 |
| KR | 2005-0090259 | 9/2005 |

* cited by examiner

LIGHT EMITTING DEVICE

BACKGROUND OF THE INVENTION

1. Field of the Invention

The present invention relates to a light emitting device having a light emitting element.

2. Description of the Related Art

In recent years, the development of display devices that use a light emitting element which utilizes the EL phenomenon of light emitting material (hereinafter referred to as an 'electroluminescent element' or an 'EL element') in a pixel (hereinafter referred to as 'electroluminescent display devices' or 'EL display devices') has made progress.

Light emitting materials used in EL elements include inorganic light emitting materials and organic light emitting materials. Organic light emitting materials have the advantage of low driving voltage. However, organic EL elements that use organic material are easily affected by moisture and oxygen, compared with inorganic EL elements. Therefore, an organic EL display device structure in which an EL element is sealed between a pair of substrates such that water and oxygen does not penetrate from outside is known.

Figure 10A:
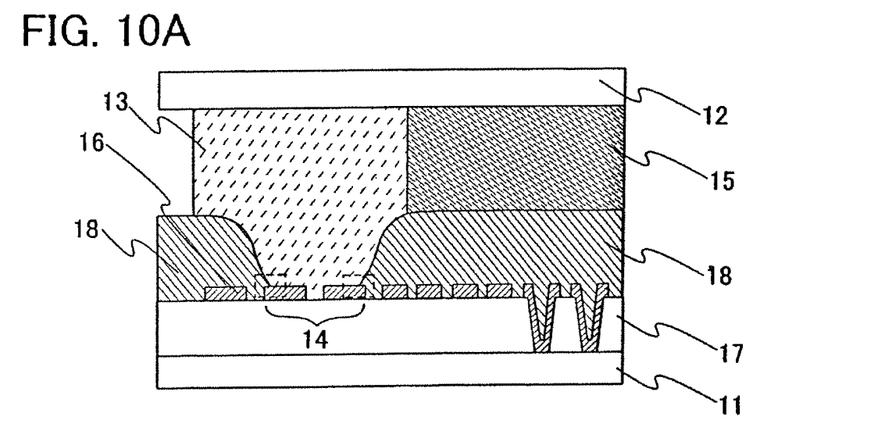
FIGS. 10A and 10B illustrate examples of conventional art.
Figure 10B:
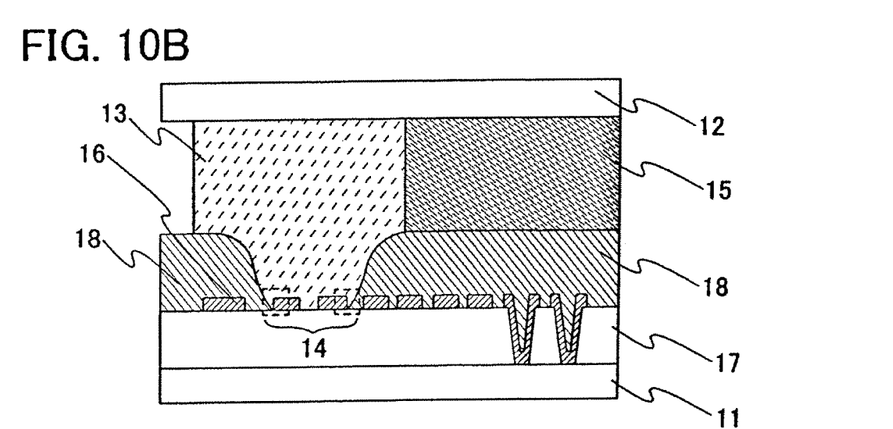

FIGS. 10A and 10B show a conventional EL display device. FIGS. 10A and 10B are a cross-section of a portion in which a sealant is provided. Reference numerals 11 and 12 indicate substrates. The substrates in FIGS. 10A and 10B are provided with EL elements, although they are not shown in the drawings. The substrate 12 is a sealing substrate for sealing the EL element. The substrate 11 has a sealing region 14 in which the sealant 13 is provided. The sealing substrate 12 is fixed to the substrate 11 by the sealant 13. The space between the substrate 11 and the substrate 12 is filled with a filler material 15, such as resin.

Reference numeral 16 indicates a lead wiring, such as a power source line, a signal line, or the like, which leads from a source driver, a gate driver, an FPC terminal, or the like. Reference numerals 17 and 18 indicate insulating films. The insulating film 18 is for separating a light emitting layer of an EL element in a pixel from the light emitting layer of an EL element in another pixel in a pixel portion, and is called an embankment, a bank, or a partition wall. Here, the insulating film 18 is referred to as a partition wall. An opening is formed in a section that corresponds to the sealing region of the partition wall 18. The opening is where the sealant 13 is to be provided.

SUMMARY OF THE INVENTION

By providing an opening in the partition wall 18 in this manner, many sections can be formed in which an upper surface of the wiring 16 overlaps with an end portion of the partition wall 18, as shown in FIG. 10A (the sections surrounded by dotted lines), and many sections can be formed in which a side surface of the wiring 16 is in alignment with an end portion of the partition wall 18, as shown in FIG. 10B (the sections surrounded by dotted lines). It has come to be known that the end portion of the partition wall 18 peels off easily in these sections. An end portion of the partition wall 18 that has come off the substrate 11 becomes a contaminant, and there is a risk that it may enter the pixel portion. If such an insulating film is attached to a light emitting element, poor quality display results.

One cause of the partition wall 18 peeling is that when organic resin is used for the partition wall 18, the partition wall 18 has poor adhesion to a conductive film which is used as the wiring 16. In particular, the partition wall 18 has particularly poor adhesion to a wiring with a titanium (Ti) surface.

In the case of forming the partition wall 18 with organic resin, after providing an opening in the sealing region 14, there is a baking process to remove moisture. However, since this baking process contracts the partition wall 18, when an end portion of the partition wall 18 overlaps with a step portion of the wiring 16, at that section, the partition wall 18 may be cut off or the like, and easily peels. This is because the end portion of the partition wall 18 becomes thin as a result of the opening being provided in the sealing region 14.

An object of the present invention is to prevent an end portion of a partition wall which is adjacent to a sealing region from peeling off.

A light emitting device of the present invention includes a first substrate and a second substrate. The first substrate includes a pixel portion having a light emitting element, and a sealing region in which a sealant is formed in a section surrounding the pixel portion. The second substrate is fixed to the first substrate by the sealant.

In the present invention, an EL element can be used as a light emitting element. As an EL element, an inorganic EL element, an organic EL element, or an EL element which uses a light emitting material which is a mixture of an inorganic light emitting material and an organic light emitting material can be used.

As examples of a light emitting device of the present invention, an EL display device, a lighting device, and the like can be given. The EL display device may be active or passive. Further, as an example of a lighting device, a backlight of a liquid crystal panel can be given.

In order to achieve the above-mentioned object, in the present invention, an end portion of a partition wall that is adjacent to a sealing region does not overlap with a step between a base film and a conductive film such as a wiring of a driver circuit or a lead wiring. A first substrate includes a first insulating film, a conductive film over the first insulating film, and a second insulating film over the conductive film. A section of the second insulating film where a sealing region is to be formed is removed, and a sealant is provided in the sealing region. An end portion of the second insulating film which is adjacent to the sealant does not overlap with a step made by a side surface and an upper surface of the conductive film.

The second insulating film which serves as the partition wall is a film formed of an organic resin, for example, acrylic, polyimide-polyamide, or polyimideamide. Further, a film formed by applying an insulating film material that has been dissolved in an organic solvent, then conducting heat treatment—a so-called coated silicon oxide film (also called a 'spin on glass' film, referred to as an 'SOG' film below)—can be used as the second insulating film. For example, a film formed of a material in which a siloxane bond is formed by baking, such as a siloxane polymer, can be used.

One feature of the present invention is that peeling of a partition wall is prevented by forming an insulating film, which adheres well to an insulating film which forms the partition wall, between a wiring and the insulating film which forms the partition wall, so that the wiring and the insulating film which forms the partition wall are not in direct contact. That is, on a first substrate are formed a first insulating film, a conductive film over the first insulating film, a second insulating film over the conductive film, and a third insulating film over the second insulating film. A section of the third insulating film where a sealing region is to be formed is removed, and a sealant is provided in the sealing region. The second insulating film is formed of inorganic material, and the third insulating film is provided in such a manner that it is not in contact with the conductive film.

As the second insulating film formed of inorganic material, any one of a silicon oxide film, a silicon nitride film, and a silicon oxynitride film can be used, or a plurality of those films can be layered.

Further, the third insulating film which serves as a partition wall is formed of an organic resin, for example, acrylic, polyimide-polyimide, or polyimideamide. Further, as the second insulating film, an SOG film, such as a film formed of a material in which a siloxane bond is formed by baking, for example, a siloxane polymer, can also be used.

One feature of the present invention is that peeling of a partition wall is prevented by using an inorganic film that adheres well to a wiring as a material for the partition wall. A first substrate includes a first insulating film, a conductive film which is over the first insulating film, and a second insulating film formed of inorganic material which is over the conductive film. A section of the second insulating film where a sealing region is to be formed is removed, and a sealant is provided in the sealing region.

As the second insulating film, which serves as the partition wall, any one of a silicon oxide film, a silicon nitride film, and a silicon oxynitride film is used, or a plurality of such films is layered.

The conductive film, provided below the insulating film serving as the partition wall, serves as a wiring or as an electrode. For the conductive film, a film formed of aluminum, titanium, molybdenum, or tungsten, or of a material chosen from among compounds of such metals can be used. Alternatively, a layered plurality of such films can be used.

According to the present invention, an end portion of an insulating film which is adjacent to a sealant can be prevented from peeling off.

DETAILED DESCRIPTION OF THE INVENTION

Embodiment Modes

The present invention will be described below by way of embodiment modes, with reference to the accompanying drawings. In the drawings, parts which are the same or which have similar functions are denoted by the same reference numerals, and repetitious explanation thereof is omitted. The invention can be carried out in many different modes, and those skilled in the art will appreciate that a variety of modifications can be made to the embodiment modes without departing from the spirit and scope of the invention. Accordingly, the present invention is not to be construed as being limited to the embodiment modes described below.

Embodiment Mode 1

Figure 1A:
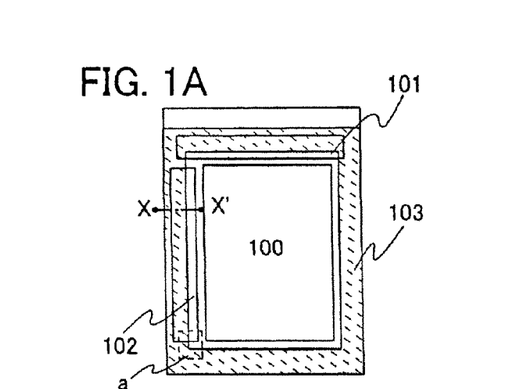
FIGS. 1A and 1B are explanatory diagrams of Embodiment Mode 1.
Figure 1B:
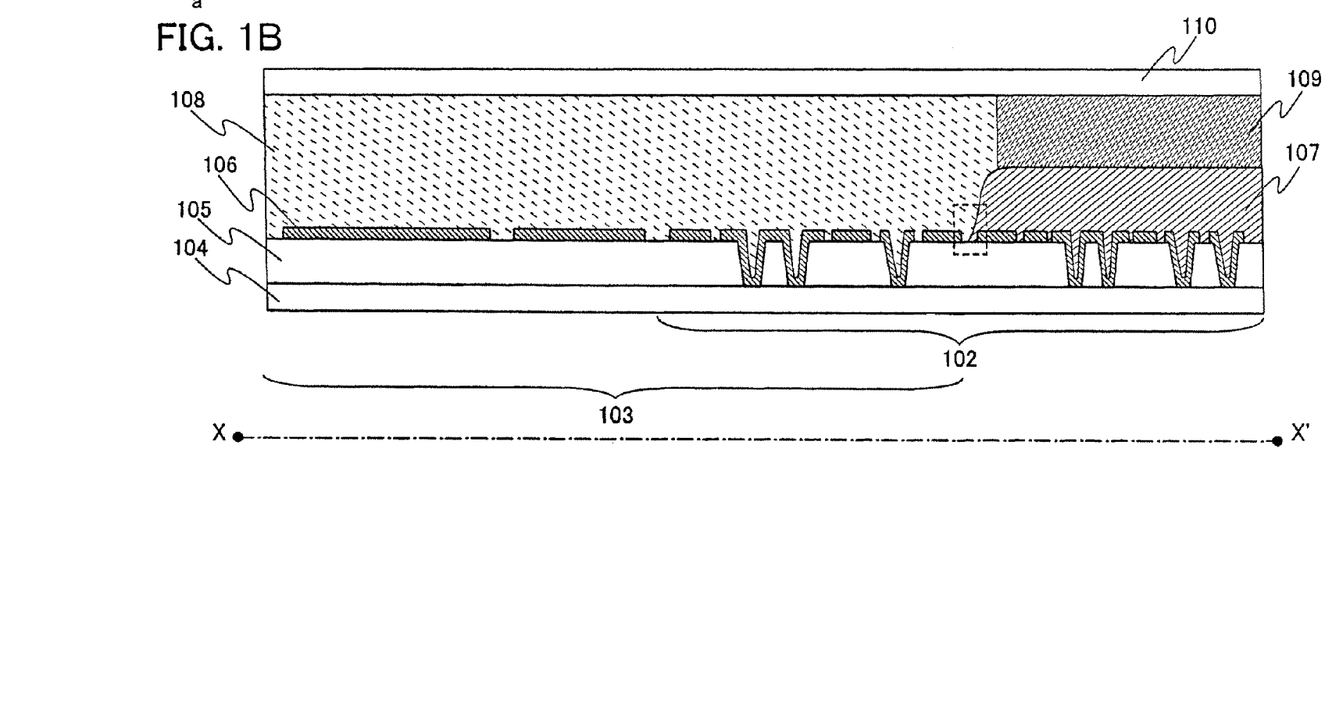

FIG. 1A is a top view of a display device. FIG. 1B is a cross-section taken along line X to X' of FIG. 1A. As shown in FIG. 1A, the display device includes a pixel portion 100 having a light emitting element, a source driver 101 and a gate driver 102 as driver circuit portions, and a sealing region 103 on the periphery of the pixel portion 100, which surrounds the pixel portion 100. The sealing region 103 is a region where a sealant is provided for the purpose of sealing. A structure in which the source driver 101 and the gate driver 102 are not provided over a first substrate 104 is also included in this embodiment mode.

An insulating film 105 is provided over the first substrate 104. As the insulating film 105, for example, a single layer film of inorganic material, such as a silicon oxide film, a silicon nitride film, or a silicon oxynitride film is used, or a layered film including a plurality of one or more of such films can be used. For example, a three-layer silicon oxynitride film in which the composition ratio of each layer differs can be used.

Over the insulating film 105, a conductive film 106 which serves as wirings or as electrodes is provided. The conductive film 106 is formed of metal or a metal compound, and is a single layer film or a layered film. For example, a film formed of a layer of titanium (Ti), a layer of aluminum (Al), and a layer of titanium (Ti) can be used.

An insulating film 107 formed of organic material is formed over the conductive film 106. The insulating film 107 serves as a partition wall. As examples of the insulating film 107, an organic resin such as polyimide or acrylic can be given. The insulating film 107 formed of organic material has good adhesion to the insulating film 105; however, it has poor adhesion to the conductive film 106.

A section of the insulating film 107 formed of organic material where the sealing region 103 which surrounds the pixel portion 100 is to be formed is selectively removed. The sealing region 103 is formed to a size which is ideal for the size and type of the display device and which is in accordance with processing rules. The sealing region 103 is formed to a size which is sufficient for the formation of the sealant 108.

The second substrate 110 is a sealing substrate, and is fixed to the first substrate 104 by the sealant 108, which is provided in the sealing region 103. A sealed space between the first substrate 104 and the second substrate 110 is filled with a filler material 109, such as an organic resin.

In the sealing region 103, the insulating film 107 formed of organic material is removed. An end portion of the insulating film 107 of organic material that is adjacent to the sealing region is not in contact with a side surface of the conductive film 106. As shown in FIG. 1B, the end portion of the insulating film 107 is formed over the insulating film 105 between conductive films 106. In other words, the end portion of the insulating film 107 is only in contact with an upper surface of the insulating film 105, and not with a side surface of the conductive film 106.

In this embodiment mode, the end portion of the insulating film 107 formed of organic material is disposed such that it is not in contact with a side surface of the conductive film 106. Thus, the end portion of the insulating film 107 formed of organic material is prevented from peeling off.

Figure 2A:
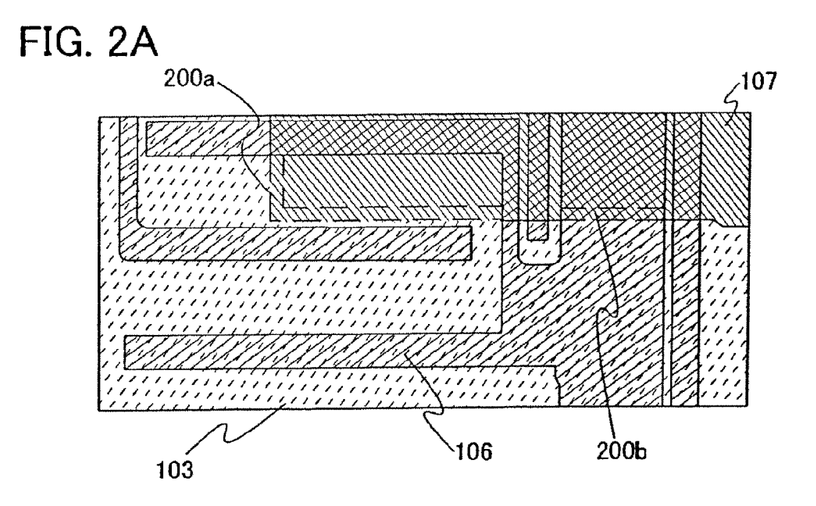
FIGS. 2A and 2B are explanatory diagrams of Embodiment Mode 1.
Figure 2B:
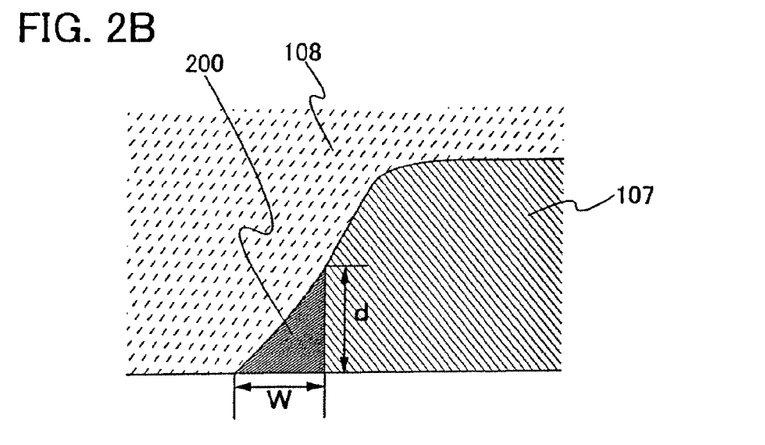

The positional relationship of the conductive film 106 and the insulating film 107 will be explained with reference to FIGS. 2A and 2B. FIG. 2A is an enlarged version of the region indicated by 'a' in FIG. 1A. FIG. 2B is a drawing which illustrates the end portion of the insulating film 107. In a most preferable mode of this embodiment mode, none of the end portion of the insulating film 107 is over the conductive film 106. In this embodiment mode, the end portion of the insulating film 107 does not overlap with at least a step formed by a side surface and a top surface of the conductive film 106. The film thickness of the end portion of the insulating film 107 is very thin, so by ensuring the end portion does not overlap with the step of the conductive film 106, the end portion can be prevented from peeling off.

The end portion of the insulating film 107 will be described with reference to FIG. 2B. In this embodiment mode, the end portion of the insulating film 107 refers to a region 200 whose width 'W' from the boundary of the sealing region (i.e., from a tip of the insulating film 107 which is in contact with the sealant 108) is 0.5 μm. Alternatively, the end portion of the insulating film 107 refers to a region 200 whose film thickness 'd' from the boundary of the sealing region 103 is 42 nm or less. Further, from the standpoint of preventing peeling from the end portion, it is more preferable to consider the end portion of the insulating film to be a region whose film thickness 'd' from the boundary of the sealing region 103 is 50 nm or less. In this embodiment mode, the end portion of the insulating film 107 is a region 200 determined by either the width 'W' or the film thickness 'd' from the tip of the insulating film 107, as explained above. The term 'end portion of the insulating film 107' refers to the same region in the other embodiment modes.

In this embodiment mode, the region 200, which is the end portion of the insulating film 107, is provided such that it does not overlap with the step of the conductive film 106. In other words, the entire end portion of the insulating film 107 is provided such that it is positioned on an upper surface of the conductive film 106, or on an upper surface of the insulating film 105, which is the base section of the conductive film 106. For example, as shown in FIG. 2A, an end portion 200a of the insulating film 107 is formed on the insulating film 105, or an end portion 200b of the insulating film 107 is formed on the conductive film 106. The end portion 200a and the end portion 200b are shown representatively. However, in this embodiment mode, in the section of the insulating film 107 which is in contact with the sealing section 103, the region 200 (i.e., the end portion of the insulating film 107) is disposed only on an upper surface of the insulating film 105, in the same manner as the end portion 200a, or only on an upper surface of the conductive film 106, in the same manner as the end portion 200b.

Embodiment Mode 2

Figure 3A:
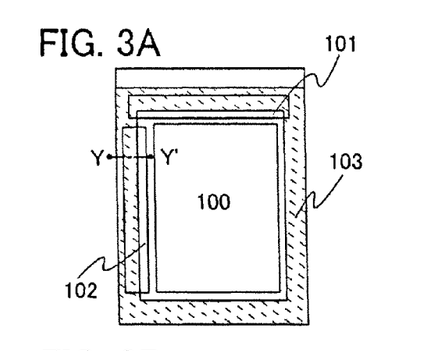
FIGS. 3A and 3B are explanatory diagrams of Embodiment Mode 2.
Figure 3B:
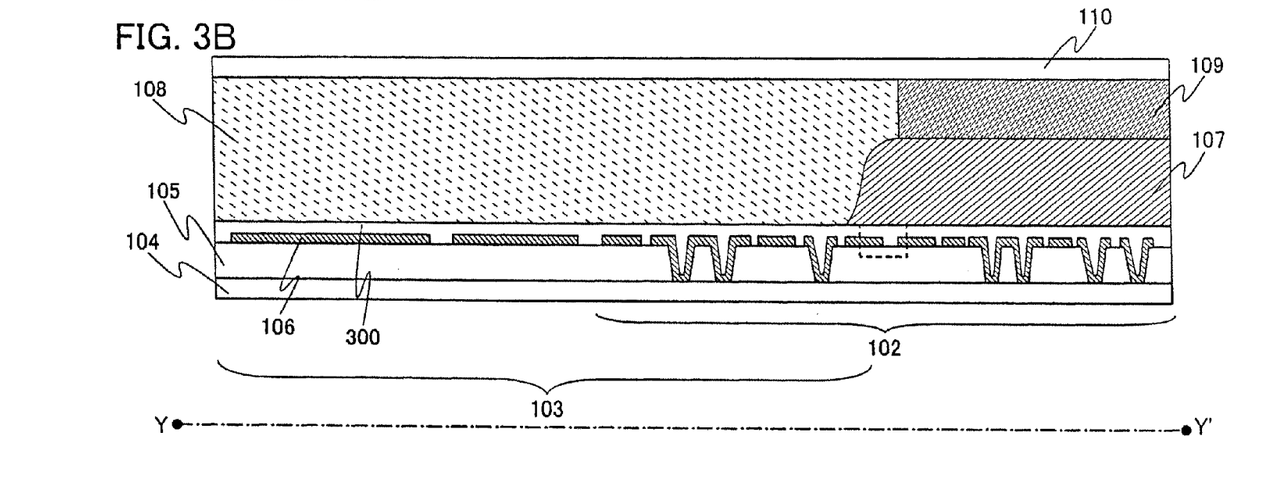

In this embodiment mode, a method of preventing an end portion of an insulating film from peeling off by ensuring that a wiring and a partition wall are not in direct contact is explained. FIG. 3A is a top view of a display device. FIG. 3B shows a cross-section taken along line Y to Y' of FIG. 3A. In this embodiment mode, a surface of the sealing region 103 is covered by an insulating film 300 formed of inorganic material.

Figure 4A:
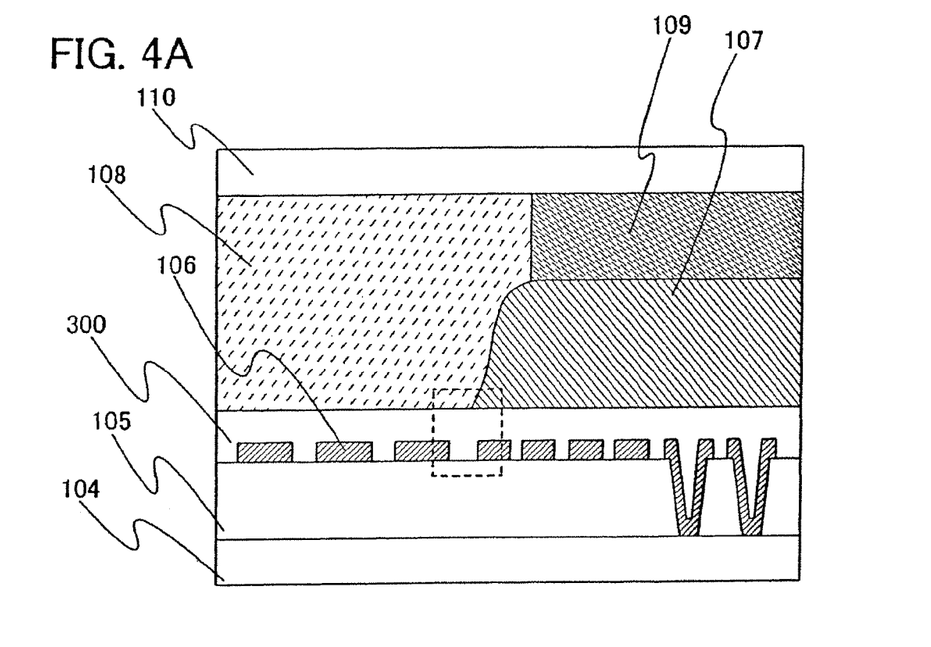
FIGS. 4A and 4B are explanatory diagrams of Embodiment Mode 2.
Figure 4B:
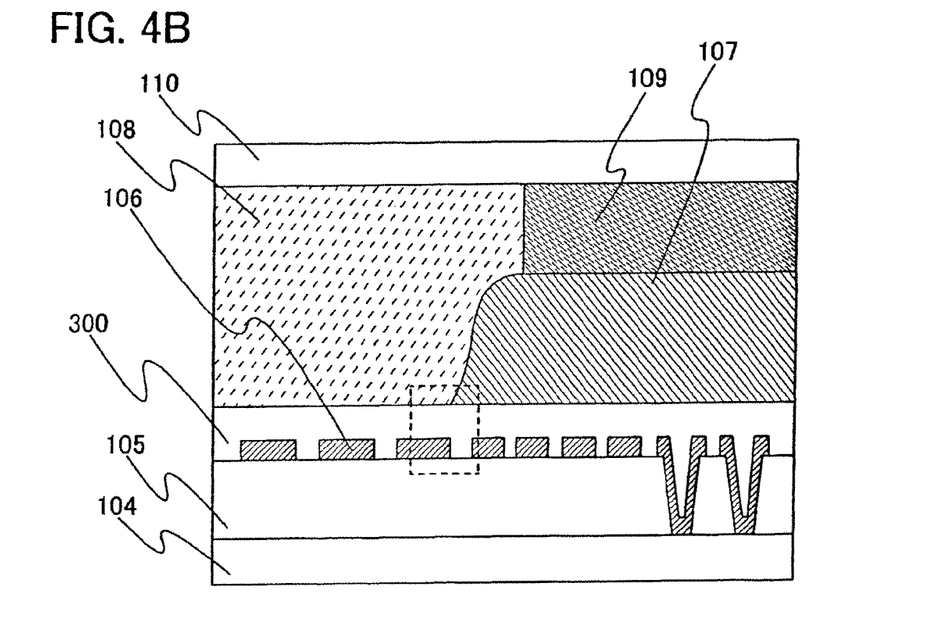

In this embodiment mode, an insulating film 300 formed of inorganic material is provided over the entire substrate 104, covering a conductive film 106. As the insulating film 300 formed of inorganic material, for example, a silicon oxide film, a silicon nitride film, a silicon oxynitride film, or the like, can be used. The insulating film 300, which is formed of an inorganic material which has good adhesion to organic material, is interposed between the conductive film 106 and the insulating film 107 formed of organic material. Therefore, even if an end portion of the conductive film 106 overlaps with an end portion of the insulating film 107, as shown in FIG. 4A, or is in alignment with an end portion of the insulating film 107, as shown in FIG. 4B, peeling of the insulating film 107 formed of organic material can be prevented. Accordingly, in this embodiment mode, the degree of freedom of the layout of the conductive film 106 and the sealing region 103 is increased.

Embodiment Mode 3

In this embodiment mode, a method of preventing an end portion of an insulating film from peeling off by changing the material used for the insulating film, which serves as a partition wall, is explained.

Figure 5A:
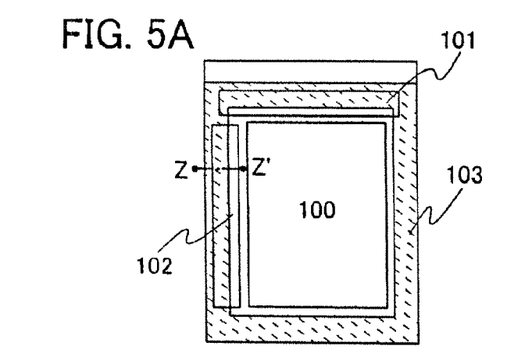
FIGS. 5A and 5B are explanatory diagrams of Embodiment Mode 3.
Figure 5B:
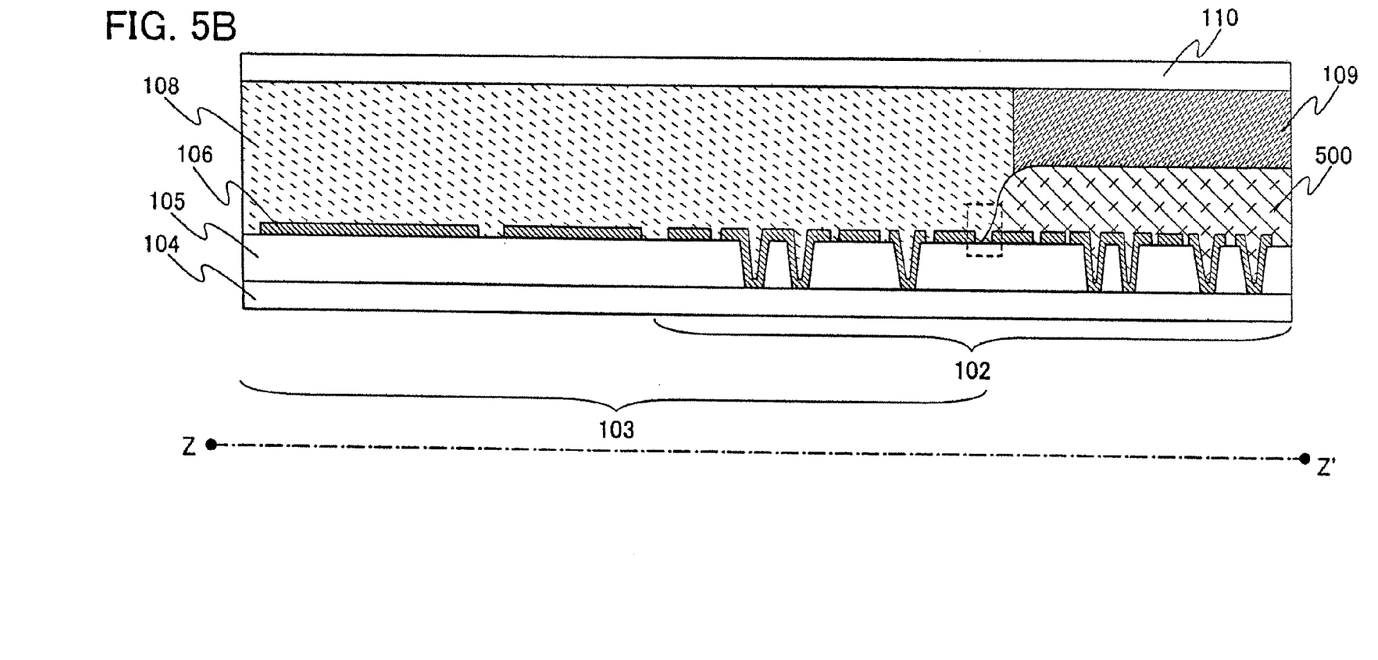

FIG. 5A is a top view of a display device. FIG. 5B shows a cross-section taken along line Z to Z' of FIG. 5A.

In this embodiment mode, instead of an insulating film 107 formed of organic material, an insulating film 500 formed of inorganic material is provided. As shown in FIG. 5B, an end portion of the insulating film 500 is provided between conductive films 106 which are adjacent to each other. For the insulating film 500, a single layer film of silicon oxide, silicon nitride, or silicon oxynitride can be used, or a layered film including such single layer films can be used.

By forming the insulating film 500 of inorganic material, its adhesion with the conductive film 106 is improved. Accordingly, the degree of freedom of the layout of the conductive film 106 is increased. An end portion of the conductive film 106 may overlap with an end portion of the insulating film 500, or it may be in alignment with an end portion of the insulating film 500. Since the insulating film 500 formed of inorganic material has good adhesion to the conductive film 106, peeling of the inorganic insulating film 500 formed of inorganic material can be prevented. Further, the degree of freedom of the layout of the conductive film 106 and the layout of the sealing region 103 is increased.

Embodiment 1

Figures 6A, 6B:
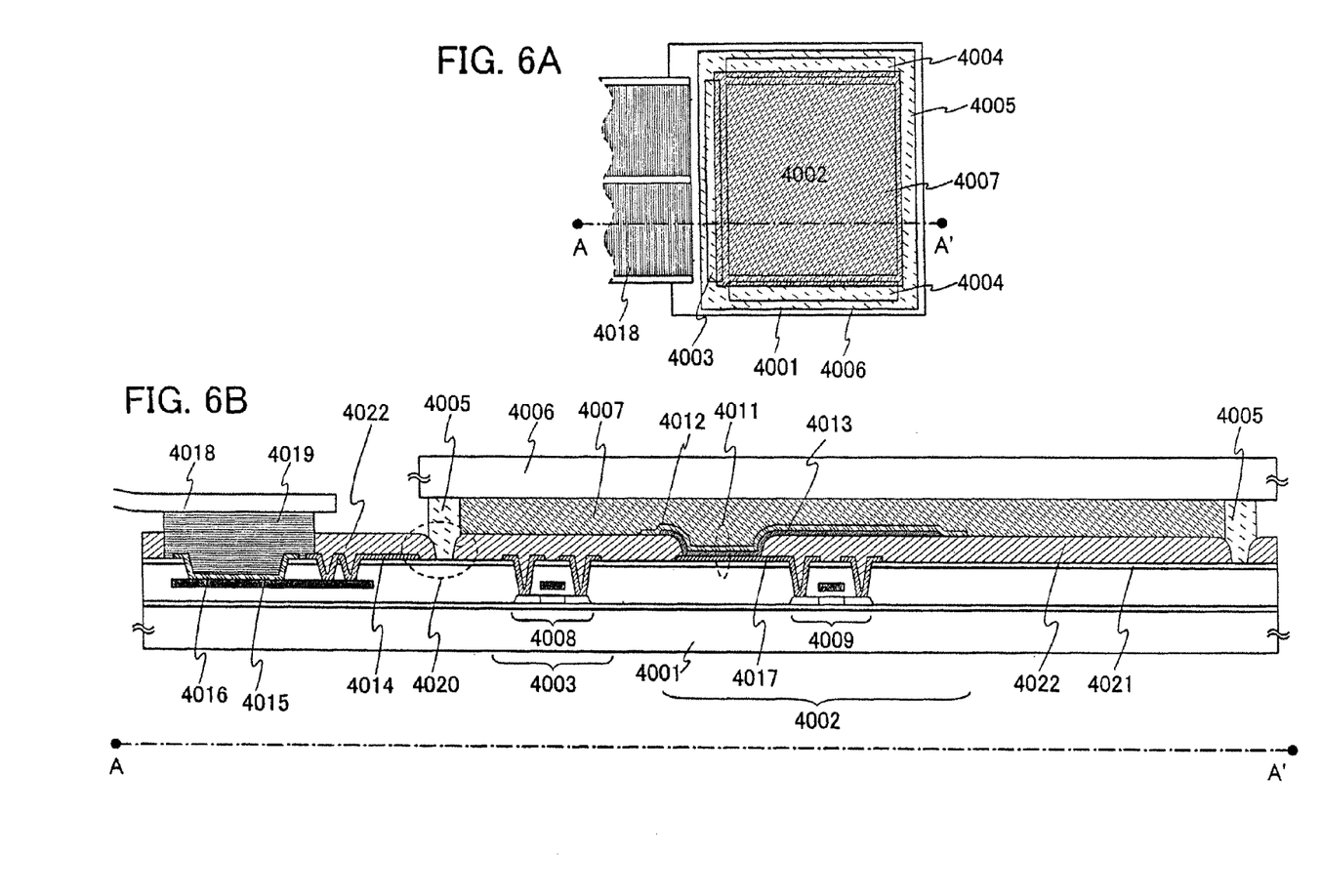
FIGS. 6A and 6B show cross-sections of a light emitting device (an EL display device) of Embodiment 1.

This embodiment is an example of the application of the present invention to an EL display device. This embodiment will be explained using FIGS. 6A and 6B. FIG. 6A is a top view of a panel in which TFTs and light emitting elements formed over a first substrate are sealed between the first substrate and a second substrate by a sealant. FIG. 6B is a cross-section corresponding to line A to A' of FIG. 6A.

A pixel portion 4002, a source driver 4003, and a gate driver 4004 are provided over the first substrate 4001, and the sealant 4005 is provided so as to surround the pixel portion 4002. Further, over the pixel portion 4002, the second substrate 4006 is provided, with the sealant 4005 interposed therebetween. The pixel portion 4002, the source driver 4003, the gate driver 4004, and the filler material 4007 are sealed in by the first substrate 4001, the sealant 4005, and the second substrate 4006.

As the first substrate 4001 and the second substrate 4006, glass, metal (representatively, stainless steel), ceramics, or plastic can be used. As a plastic, an FRP (fiberglass reinforced plastic) substrate, a PVF (polyvinyl fluoride) film, a Mylar film, a polyester film, or an acrylic resin film can be used. Further, a sheet with a structure in which aluminum foil is interposed between PVF films or Mylar films or between a PVF film and a Mylar film can also be used. The substrate positioned where the light from the light emitting element 4011 is to pass through should have a light transmitting property. For such a substrate, a material having a light transmitting property is used. For example, a glass substrate, a plastic substrate, a polyester film, or an acrylic film is used.

As the filler material 4007, besides an inert gas such as nitrogen or argon, an ultraviolet curing resin or a thermoset resin can be used. PVC (polyvinyl chloride), acrylic, polyimide, an epoxy resin, a silicon resin, PVB (polyvinyl butyral), or EVA (ethylene vinyl acetate) can also be used. In this embodiment, nitrogen is used as the filler material.

The pixel portion 4002, the source driver 4003, and the gate driver 4004, which are provided over the first substrate 4001, include a plurality of thin film transistors (TFTs). In FIG. 6B, a TFT 4008 included in the source driver 4003 and a TFT 4009 included in the pixel portion 4002 are shown by way of example.

Reference numeral 4011 corresponds to a light emitting element. A part of a wiring 4017 which is connected to a drain of the TFT 4009 serves as a first electrode of the light emitting element 4011. A transparent conductive film 4012 serves as a second electrode of the light emitting element 4011. Between the first electrode and the second electrode is a light emitting layer 4013 which includes a light emitting material. Note that the structure of the light emitting element 4011 is not limited to the structure shown in this embodiment. The structure of the light emitting element 4011 can be changed as appropriate, in accordance with the direction in which light from the light emitting element 4011 passes, as mentioned above, or the polarity of the TFT 4009, for example. Light from the light emitting element 4011 may go toward the first substrate 4001 side, the second substrate 4006 side, or toward both the first substrate 4001 side and the second substrate 4006 side.

Various signals and voltages provided to the source driver 4003, the gate driver 4004 or the pixel portion 4002 are not shown in the cross-section of FIG. 6B. However, they are supplied from an FPC terminal 4016 through power source lines 4014 and 4015, which lead out from the FPC terminal 4016.

In this embodiment, the FPC terminal 4016 is formed from the same conductive film as the first electrode of the light emitting element 4011. Further, the power source line 4014 is formed from the same conductive film as the wiring 4017. Moreover, the power source line 4015 is formed from the same conductive film as the gate of the TFT 4009 and the gate of the TFT 4008.

The FPC terminal 4016 is electrically connected to a terminal included in an FPC 4018 by an anisotropic conductive film 4019.

For an insulating film 4022, a single layer film or a layered film of an organic resin material such as polyimide, acrylic, or polyimideamide can be used. For an insulating film 4021, a single layer film or a layered film formed of an inorganic material, such as a silicon oxide film, a silicon nitride film, or a silicon oxynitride film, can be used.

The insulating film 4022 is an insulating film which separates the light emitting layer 4013 of the light emitting element 4011 in one pixel from the light emitting layer 4013 of the light emitting element 4011 in another pixel, and is formed over an entire surface of the first substrate 4001. Openings are formed in the insulating film 4022 by selectively removing a region where the light emitting element 4011 is formed and a sealing region 4020 by etching. As shown in FIG. 6B, in the sealing region 4020, an end portion of a conductive film, typified by the power source line 4014, does not overlap with or align with an end portion of the insulating film 4022. As a result, since an end portion of the insulating film 4022 is in contact with the insulating film 4021, which is formed with an inorganic material which has good adhesion to the insulating film 4022, peeling from an end portion of the insulating film 4022 formed of organic material can be prevented.

Embodiment 2

In this embodiment, a circuit of the pixel portion in Embodiment 1 will be explained. Note that the pixel circuit of the present invention is not limited to the circuit described in this embodiment.

Figure 7:
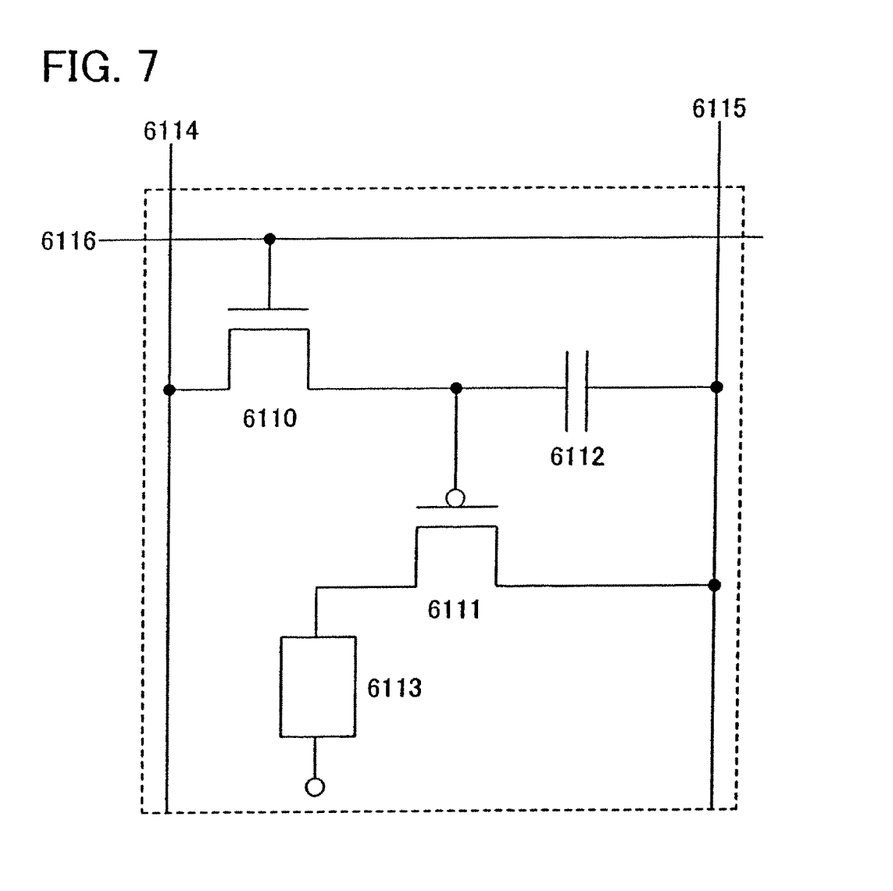
FIG. 7 shows a pixel circuit of Embodiment 2.

FIG. 7 is an example of an equivalent circuit diagram of a pixel. The pixel includes a signal line 6114, a power source line 6115, a scan line 6116, a light emitting element 6113, transistors 6110 and 6111, and a capacitor element 6112. A video signal is input to the signal line 6114 by the source driver. According to a selection signal input to the scan line 6116, the transistor 6110 can control the supply of the potential of the video signal to a gate of the transistor 6111. The transistor 6111 can control the supply of current to the light emitting element 6113, according to the potential of the video signal. The capacitor element 6112 can store the gate-source voltage of the transistor 6111. Note that in FIG. 7, the capacitor element 6112 is illustrated, but in the case where the gate capacitance of the transistor 6111 or other parasitic capacitance is enough that the gate-source voltage of the transistor 6111 can be stored, the capacitor element 6112 does not have to be provided.

Figure 8A:
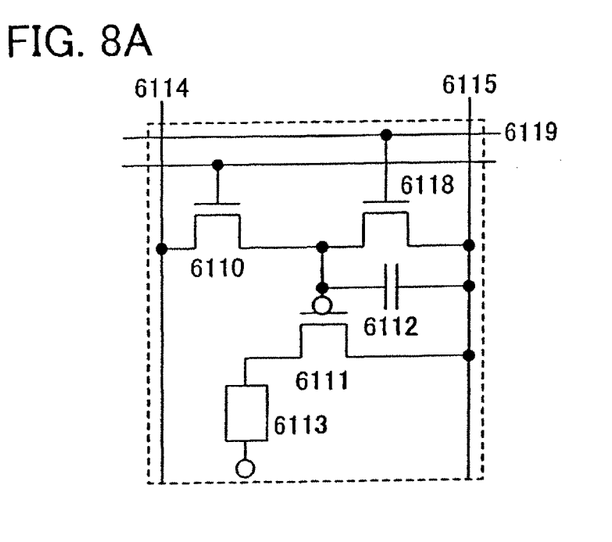
FIGS. 8A and 8B show a pixel circuit of Embodiment 2.

FIG. 8A is an equivalent circuit diagram showing the pixel of FIG. 7, with a transistor 6118 and a scan line 6119 additionally provided. The transistor 6118 can make the potentials of the gate and the source of the transistor 6111 equal, and forcibly create a state in which current does not flow to the light emitting element 6113. Therefore, the length of a sub-frame period can be made shorter than the time it takes for video signals to be input to all the pixels. Accordingly, this is suitable for conducting display with a high total number of gradations while suppressing drive frequency.

Figure 8B:
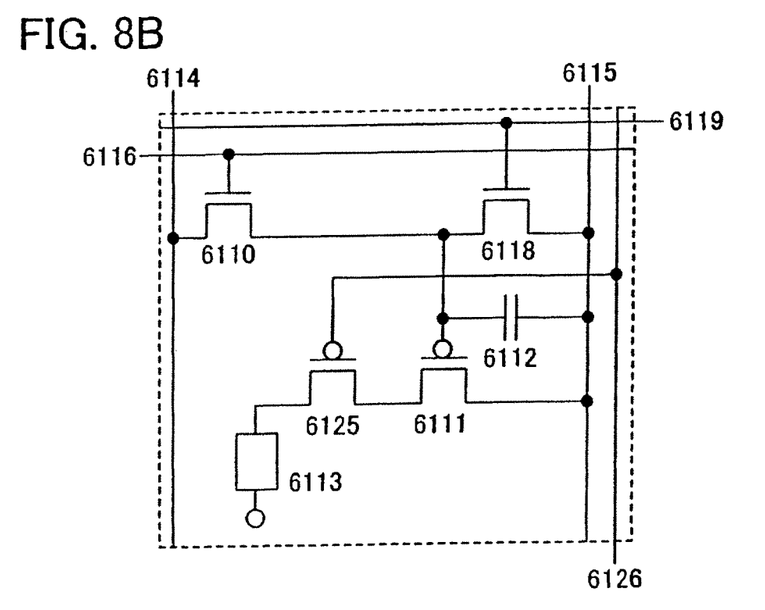

FIG. 8B is an equivalent circuit diagram of the pixel shown in FIG. 8A, with a transistor 6125 and a wiring 6126 additionally provided. The electric potential of a gate of the transistor 6125 is fixed by the wiring 6126. Further, the transistor 6111 and the transistor 6125 are connected in series between the power source line 6115 and the light emitting element 6113. Therefore, in the pixel shown in FIG. 8B, the amount of current supplied to the light emitting element 6113 is controlled by the transistor 6125, and the transistor 6111 can control whether or not the current is supplied to the light emitting element 6113.

Embodiment 3

An EL display device to which the present invention is applied is suitable for use in the display portion of a battery-powered electronic device, or for use as the display device of a large screen, or for use in the display portion of an electronic device. For example, an EL display device to which the present invention is applied may be applied to a television device (for example, a television or a television receiver), a camera, such as digital camera or a digital video camera, a portable telephone device (for example, a portable telephone), a portable information terminal, such as a PDA, a portable game machine, a monitor, a computer, a sound reproduction device such as a car audio device, an image reproduction device equipped with a recording medium, such as a home game machine, or the like. Some specific examples of these will be explained with reference to FIGS. 9A to 9F.

Figures 9A, 9B:
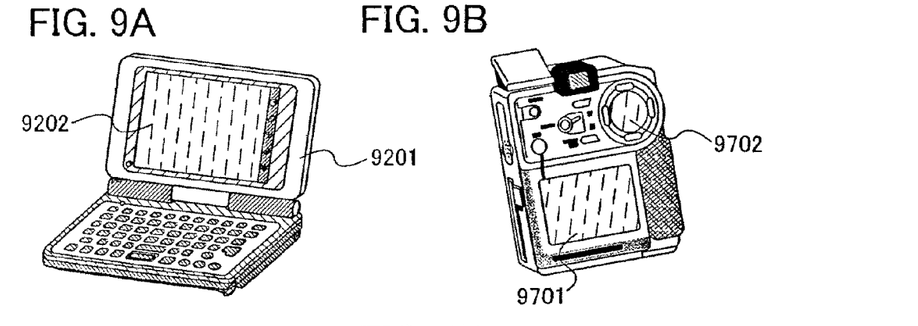
FIGS. 9A to 9F show examples of applications of the present invention to electronic devices of Embodiment 3.

The portable information terminal device shown in FIG. 9A includes a main body 9201, a display portion 9202, and the like. A display device of the present invention can be applied to the display portion 9202. Accordingly, a portable information terminal device in which peeling of a partition wall is prevented can be provided.

The digital video camera shown in FIG. 9B includes a display portion 9701, a display portion 9702, and the like. A display device of the present invention can be applied to the display portion 9701. Accordingly, a digital video camera in which peeling of a partition wall is prevented can be provided.

Figure 9C:
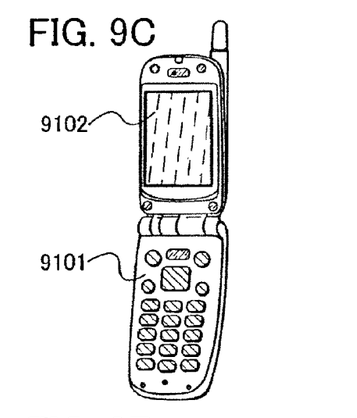

The portable telephone shown in FIG. 9C includes a main body 9101, a display portion 9102, and the like. A display device of the present invention can be applied to the display portion 9102. Accordingly, a portable telephone in which peeling of a partition wall is prevented can be provided.

Figure 9D:
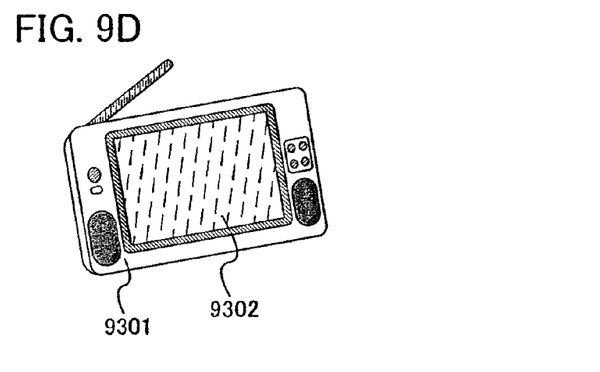

The portable television device shown in FIG. 9D includes a main body 9301, a display portion 9302, and the like. A display device of the present invention can be applied to the display portion 9302. Accordingly, a portable television device in which peeling of a partition wall is prevented can be provided. Further, a display device of the present invention can be applied to a wide range of television devices, from small television devices mounted on a portable terminal, such as a portable telephone, to medium-sized portable television devices and large television devices (for examples, those 40 inches and above).

Figure 9E:
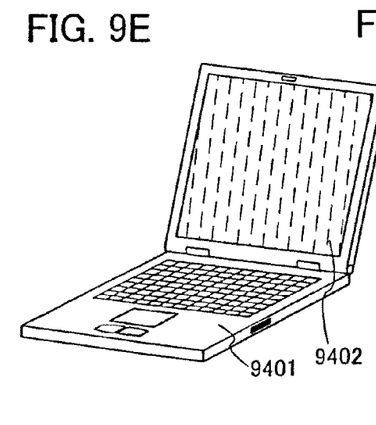

The portable computer shown in FIG. 9E includes a main body 9401, a display portion 9402, and the like. A display device of the present invention can be applied to the display portion 9402. Accordingly, a portable computer in which peeling of a partition wall is prevented can be provided.

Figure 9F:
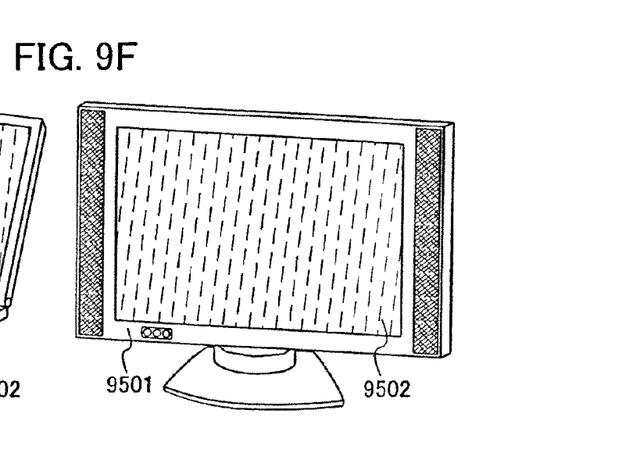

The television device shown in FIG. 9F includes a main body 9501, a display portion 9502, and the like. A display device of the present invention can be applied to the display portion 9502. Accordingly, a television device in which peeling of a partition wall is prevented can be provided.

The present application is based on Japanese Priority application No. 2006-010197, filed on Jan. 18, 2006 with the Japanese Patent Office, the entire contents of which are hereby incorporated by reference.

What is claimed is:
1. A display device comprising:
a first substrate comprising a pixel portion and a sealing region;
a sealant formed in the sealing region which surrounds the pixel portion;
a second substrate fixed to the first substrate by the sealant;
a transistor over the first substrate;
a light emitting element over the first substrate;
a conductive film over the first substrate and in contact with the sealant;
a first insulating film over an edge portion of an electrode of the light emitting element, and wherein a light emitting layer of the light emitting element is positioned over the first insulating film;
a second insulating film over the first substrate;
a first gate driver over the first substrate; and
a second gate driver over the first substrate,
wherein the first insulating film is positioned in the pixel portion,
wherein the second insulating film is positioned in a region,
wherein the sealing region is positioned between the region and the pixel portion,
wherein the first insulating film and the second insulating film are formed of the same material,
wherein the first insulating film and the second insulating film comprise organic resin,
wherein the conductive film and a source electrode and a drain electrode of the transistor are formed of the same material,
wherein the second substrate overlaps with a part of the second insulating film,
wherein the conductive film is not in contact with the first insulating film, and
wherein the conductive film is not in contact with the second insulating film.

2. The display device according to claim 1,
wherein the sealant is in contact with the first insulating film.

3. The display device according to claim 1,
wherein the sealant is in contact with the second insulating film.

4. The display device according to claim 1, further comprising a filler material over the first insulating film.

5. The display device according to claim 1,
wherein the material of the source electrode and the drain electrode and a material of the electrode of the light emitting element are the same.

6. The display device according to claim 1,
wherein an end portion of the first insulating film does not overlap with a step formed by a side surface and an upper surface of the conductive film.

7. The display device according to claim 1,
wherein the first insulating film and the second insulating film comprise organic resin, and
wherein the organic resin comprises one selected from the group consisting of acrylic, polyimide-polyamide, and polyimideamide.

8. The display device according to claim 1, wherein the conductive film comprises one selected from the group consisting of aluminum, titanium, molybdenum, and tungsten.

9. The display device according to claim 1, wherein the display device is incorporated in a portable information terminal device, a digital video camera, a portable telephone, a portable television device, a portable computer or a television device.

10. A display device comprising:
a first substrate comprising a pixel portion and a sealing region;
a sealant formed in the sealing region which surrounds the pixel portion;
a second substrate fixed to the first substrate by the sealant;
a first transistor over the first substrate;
a second transistor over the first substrate;
a third transistor over the first substrate;
a fourth transistor over the first substrate;
a capacitor over the first substrate;
a light emitting element over the first substrate;
a conductive film over the first substrate and in contact with the sealant;
a first insulating film over an edge portion of an electrode of the light emitting element, and wherein a light emitting layer of the light emitting element is positioned over the first insulating film;
a second insulating film over the first substrate;
a first gate driver over the first substrate; and
a second gate driver over the first substrate,
wherein the first insulating film is positioned in the pixel portion, wherein the second insulating film is positioned in a region,
wherein the sealing region is positioned between the region and the pixel portion,
wherein a gate of the first transistor is electrically connected to a first scan line,
wherein one of a source and a drain of the first transistor is electrically connected to a signal line,
wherein the other of the source and the drain of the first transistor is electrically connected to one of a source and a drain of the second transistor,
wherein a gate of the second transistor is electrically connected to a second scan line,
wherein the other of the source and the drain of the second transistor is electrically connected to a power source line,
wherein one of a source and a drain of the third transistor is electrically connected to the light emitting element,
wherein the other of the source and the drain of the third transistor is electrically connected to one of a source and a drain of the fourth transistor,
wherein the other of the source and the drain of the first transistor is electrically connected to the fourth transistor,
wherein a gate of the fourth transistor is electrically connected to a first electrode of the capacitor,
wherein a second electrode of the capacitor is electrically connected to the power source line,
wherein the first insulating film and the second insulating film are formed of the same material,
wherein the first insulating film and the second insulating film comprise organic resin,
wherein the conductive film and a source electrode and a drain electrode of the first transistor are formed of the same material,
wherein the second substrate overlaps with a part of the second insulating film,
wherein the conductive film is not in contact with the first insulating film, and
wherein the conductive film is not in contact with the second insulating film.

11. The display device according to claim 10,
wherein a gate of the third transistor is electrically connected to a wiring.

12. The display device according to claim 10,
wherein the other of the source and the drain of the fourth transistor is electrically connected to the power source line.

13. The display device according to claim 10,
wherein the gate of the fourth transistor is electrically connected to the other of the source and the drain of the first transistor.

14. The display device according to claim 10,
wherein the sealant is in contact with the first insulating film.

15. The display device according to claim 10,
wherein the sealant is in contact with the second insulating film.

16. The display device according to claim 10, further comprising a filler material over the first insulating film.

17. The display device according to claim 10,
wherein the material of the source electrode and the drain electrode and a material of the electrode of the light emitting element are the same.

18. The display device according to claim 10,
wherein an end portion of the first insulating film does not overlap with a step formed by a side surface and an upper surface of the conductive film.

19. The display device according to claim 10,
wherein the first insulating film and the second insulating film comprise organic resin, and
wherein the organic resin comprises one selected from the group consisting of acrylic, polyimide-polyamide, and polyimideamide.

20. The display device according to claim 10, wherein the conductive film comprises one selected from the group consisting of aluminum, titanium, molybdenum, and tungsten.

21. The display device according to claim 10, wherein the display device is incorporated in a portable information terminal device, a digital video camera, a portable telephone, a portable television device, a portable computer or a television device.

22. A display device comprising:
a first substrate comprising a pixel portion and a sealing region;
a sealant formed in the sealing region which surrounds the pixel portion;
a second substrate fixed to the first substrate by the sealant;
a transistor over the first substrate;
a light emitting element over the first substrate;
a conductive film over the first substrate and in contact with the sealant;
a first insulating film over an edge portion of an electrode of the light emitting element, and wherein a light emitting layer of the light emitting element is positioned over the first insulating film;
a second insulating film over the first substrate;
a first gate driver over the first substrate; and
a second gate driver over the first substrate,
wherein the first insulating film is positioned in the pixel portion,
wherein the second insulating film is positioned in a region,
wherein the sealing region is positioned between the region and the pixel portion,
wherein the first insulating film and the second insulating film are formed from the same layer,
wherein the first insulating film and the second insulating film comprise organic resin,
wherein the conductive film and a source electrode and a drain electrode of the transistor are formed from the same layer,
wherein the second substrate overlaps with a part of the second insulating film,
wherein in a cross section of the display device, the conductive film is not in contact with the first insulating film, and
wherein in a cross section of the display device, the conductive film is not in contact with the second insulating film.

23. The display device according to claim 22,
wherein the sealant is in contact with the first insulating film.

24. The display device according to claim 22,
wherein the sealant is in contact with the second insulating film.

25. The display device according to claim 22, further comprising a filler material over the first insulating film.

26. The display device according to claim 22,
wherein the material of the source electrode and the drain electrode and a material of the electrode of the light emitting element are the same.

27. The display device according to claim 22,
wherein an end portion of the first insulating film does not overlap with a step formed by a side surface and an upper surface of the conductive film.

28. The display device according to claim 22,
wherein the first insulating film and the second insulating film comprise organic resin, and
wherein the organic resin comprises one selected from the group consisting of acrylic, polyimide-polyamide, and polyimideamide.

29. The display device according to claim 22, wherein the conductive film comprises one selected from the group consisting of aluminum, titanium, molybdenum, and tungsten.

30. The display device according to claim 22, wherein the display device is incorporated in a portable information terminal device, a digital video camera, a portable telephone, a portable television device, a portable computer or a television device.

* * * * *